(12) United States Patent
Phillips et al.

(10) Patent No.: US 10,073,131 B2
(45) Date of Patent: Sep. 11, 2018

(54) APPARATUS AND METHOD FOR EVALUATING NON-CERAMIC INSULATORS WITH CONFORMAL PROBE

(71) Applicant: ELECTRIC POWER RESEARCH INSTITUTE, INC., Charlotte, NC (US)

(72) Inventors: Andrew John Phillips, Harrisburg, NC (US); J. Mark Major, San Antonio, TX (US); Robert Carlton Lynch, Fuquay-Varina, NC (US); Lester Ray Harrell, Concord, NC (US)

(73) Assignee: ELECTRIC POWER RESEARCH INSTITUTE, INC., Charlotte, NC (US)

( * ) Notice: Subject to any disclaimer, the term of this patent is extended or adjusted under 35 U.S.C. 154(b) by 200 days.

(21) Appl. No.: 15/067,322

(22) Filed: Mar. 11, 2016

(65) Prior Publication Data
US 2017/0261543 A1     Sep. 14, 2017

(51) Int. Cl.
*H01H 31/12*     (2006.01)
*G01R 31/12*     (2006.01)
*G01R 27/26*     (2006.01)
*H01B 17/04*     (2006.01)

(52) U.S. Cl.
CPC ...... *G01R 31/1263* (2013.01); *G01R 27/2617* (2013.01); *H01B 17/04* (2013.01)

(58) Field of Classification Search
CPC ........ H01B 17/32; H01B 17/50; H01B 17/36; H01B 17/46; H01B 19/04; H01B 17/04; H01B 17/06; H01B 17/26; H01B 17/34; H01B 17/38; H01B 17/42; H01B 17/52; H01B 19/00; H01B 3/00; H01B 3/02; H01B 3/04; H01B 3/46; G01R 1/06788; G01R 31/1245; H01R 11/12; H01R 4/305; H01R 4/38

See application file for complete search history.

(56) References Cited

U.S. PATENT DOCUMENTS

| | | | |
|---|---|---|---|
| 1,366,078 A * | 1/1921 | Johnson, Jr. | 324/512 |
| 4,302,694 A * | 11/1981 | Fujishima | G10G 7/02 29/25.35 |
| 4,760,343 A * | 7/1988 | Vaillancourt | G01R 31/1245 324/456 |
| 5,491,411 A | 2/1996 | Wellstood et al. | |
| 5,792,996 A | 8/1998 | Phillips et al. | |
| 6,854,493 B2 | 2/2005 | Ichikawa et al. | |
| 7,210,332 B2 * | 5/2007 | Kolosov | G01N 29/022 73/24.06 |
| 7,486,084 B2 | 2/2009 | Phillips et al. | |

(Continued)

FOREIGN PATENT DOCUMENTS

| | | |
|---|---|---|
| EP | 2006699 | 12/2008 |
| RU | 2212678 | 9/2003 |

OTHER PUBLICATIONS

WIPO, International Search Report, dated Nov. 9, 2012, Russia.

*Primary Examiner* — Vinh Nguyen
(74) *Attorney, Agent, or Firm* — Trego, Hines & Ladenheim, PLLC; Brandon Trego; Jonathan Hines

(57) ABSTRACT

An apparatus for evaluating an electrical insulator includes: a frame having a base and a pair of spaced-apart resilient arms each having a distal end; and a flexible probe disposed between the arms, the flexible probe being generally U-shaped and having a pair of distal ends, each distal end of the probe being connected to a respective distal end of one of the arms.

22 Claims, 15 Drawing Sheets

(56) References Cited

U.S. PATENT DOCUMENTS

| | | | |
|---|---|---|---|
| 7,562,557 B2* | 7/2009 | Bennett | B06B 1/06 |
| | | | 310/320 |
| 9,063,188 B2* | 6/2015 | Phillips | G01R 31/12 |
| 2001/0022541 A1 | 9/2001 | Kasai et al. | |
| 2002/0074221 A1 | 6/2002 | Mallinson et al. | |
| 2002/0156385 A1 | 10/2002 | Feng et al. | |
| 2005/0262944 A1 | 12/2005 | Bennett et al. | |
| 2008/0100299 A1 | 5/2008 | Phillips et al. | |
| 2010/0100239 A1 | 4/2010 | Park et al. | |
| 2011/0101989 A1 | 5/2011 | Hyde et al. | |

* cited by examiner

US 10,073,131 B2

APPARATUS AND METHOD FOR EVALUATING NON-CERAMIC INSULATORS WITH CONFORMAL PROBE

BACKGROUND OF THE INVENTION

This application relates to an apparatus and method for identifying the presence of high conductivity or permittivity conditions in a wide range of electrically insulating materials and, more particularly, to a detector to assess the electrical integrity of a polymer insulator.

Insulators are utilized in many applications in the electrical transmission and distribution systems. The main application of an insulator is to mechanically attach current carrying conductors to support grounded structures while electrically insulating the conductors from the grounded structures.

Non-ceramic insulators ("NCI") (also called polymer or composite insulators) are considered high risk if they contain internal or external defects of conductive or high permittivity. An example of a conductive defect would include internal carbonization of the fiberglass rod due to discharge activity, and an example of a high permittivity defect would be water internal to the insulator.

A requirement for ensuring worker safety when performing live work ("LW") with polymer insulators is to confirm the short-term (i.e. for the duration of the work) electrical and mechanical integrity of both the installed and the replacement polymer units. Currently there are no generally accepted and easily applied procedures to accomplish this. Consequently, some utilities have opted not to use polymer insulators. In addition, a number of utilities that do use polymer insulators avoid live work on structures on which these insulators have been installed.

A method and apparatus for evaluating nonceramic insulators is described in U.S. Pat. No. 9,063,188 to Phillips et al. the 063' patent describes a device with a V-shaped probe. While effective to evaluate insulators, this type of probe usually requires several sizes of probes to be provided for different sizes of insulators.

Accordingly, there is a need for an apparatus and method that can identify electrical and mechanical integrity of polymer insulators of varying sizes. In addition the sensitivity of the measurement is improved by using a flexible probe that goes all the way around the circular insulator—rather than the two points of contact that a V-shaped probe provides. In addition, there is a need to allow for proves to be placed in the field in the cases that the probes are damaged, or if a different size is needed.

BRIEF SUMMARY OF THE INVENTION

This need is addressed by an apparatus utilizing electrode assemblies having a frame with a pair of spaced-apart resilient arms and a flexible probe disposed between the arms.

BRIEF DESCRIPTION OF THE DRAWINGS

The subject matter that is regarded as the invention may be best understood by reference to the following description taken in conjunction with the accompanying drawing figures in which.

DETAILED DESCRIPTION OF THE INVENTION

Figure 1:
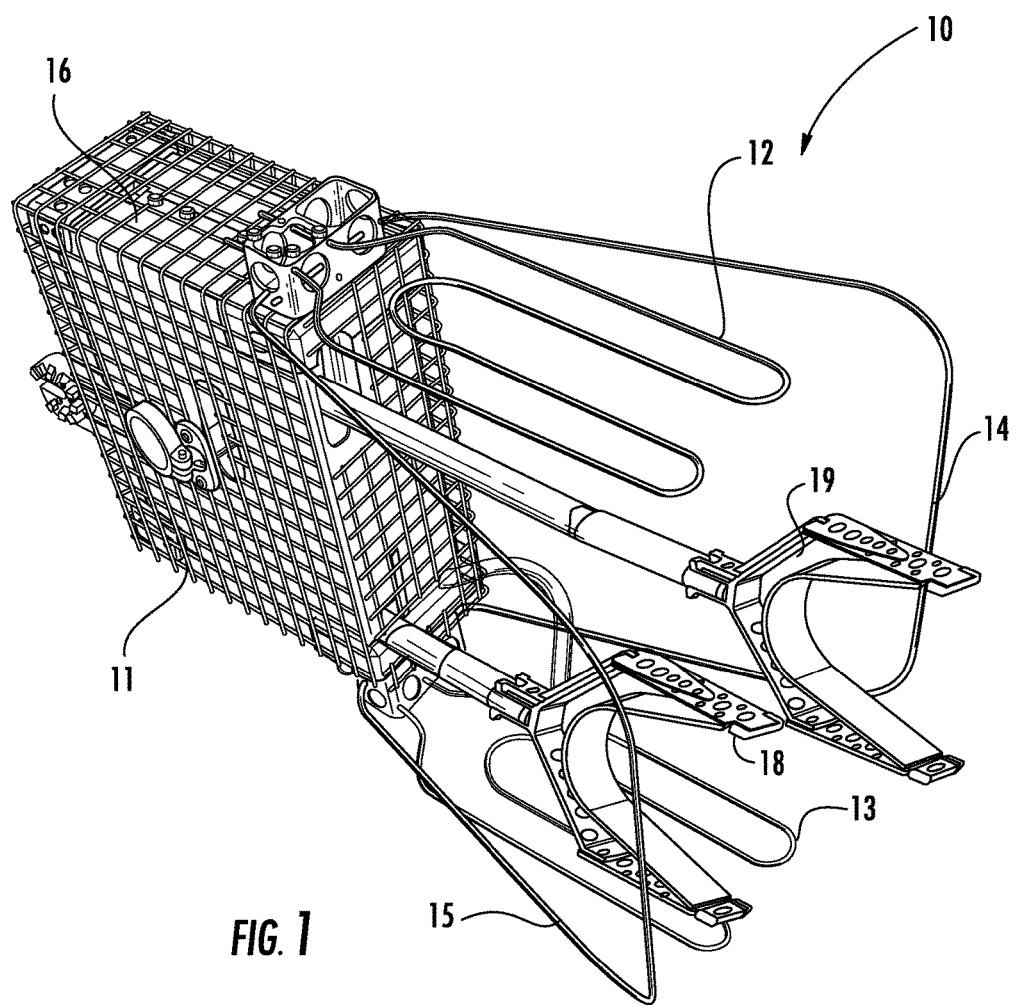
FIG. 1 is a perspective view of a detector.
Figure 2:
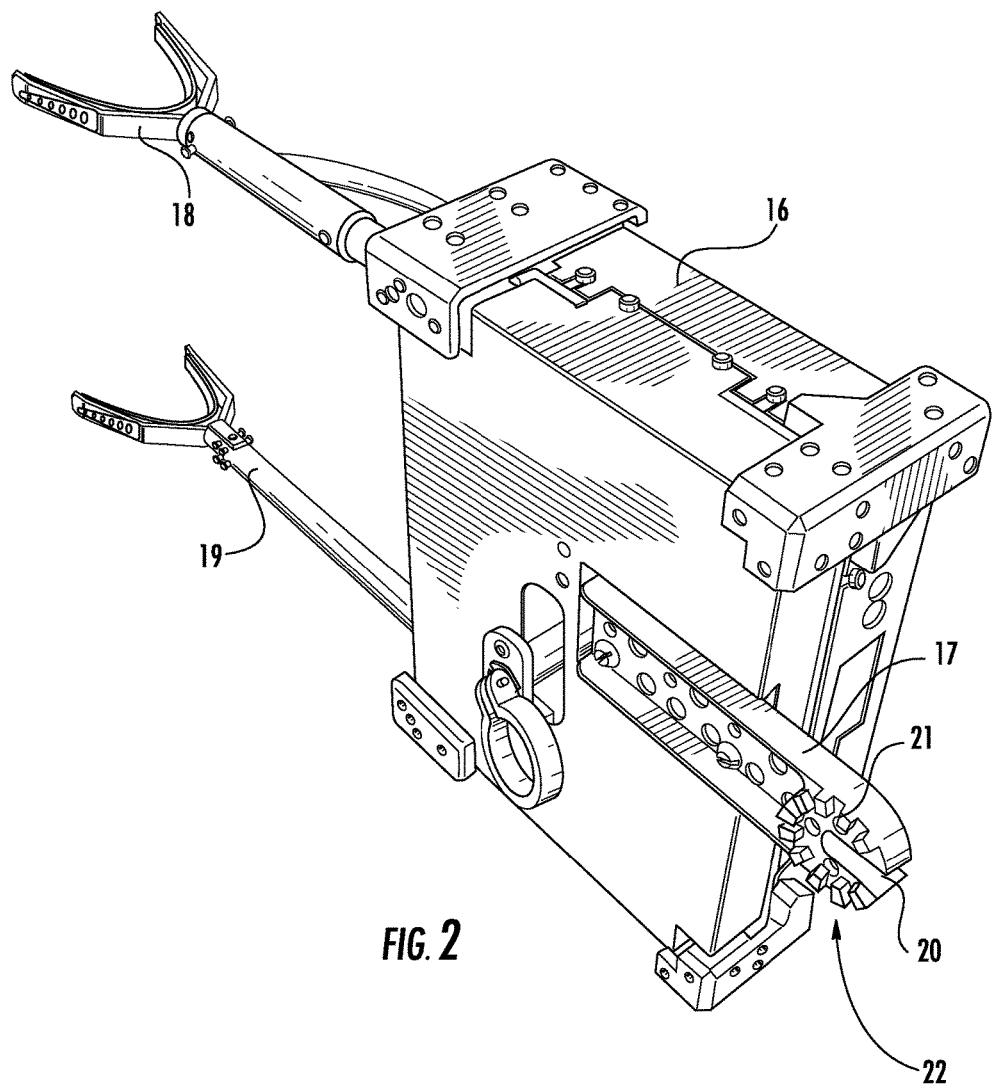
FIG. 2 is a rear perspective view of the detector of FIG. 1.

Referring to the drawings, an exemplary apparatus in form of a detector is illustrated in FIGS. 1 and 2 and shown generally at reference numeral 10. The detector 10 has the capacity to identify conductive, semi-conductive or high permittivity conditions, both internal and external without physical contact with internal conductive defects. The detector 10 is able to identify conductive, semi-conductive and high permittivity internal conditions which occur in service and are small in dimension electrically.

Figure 3:
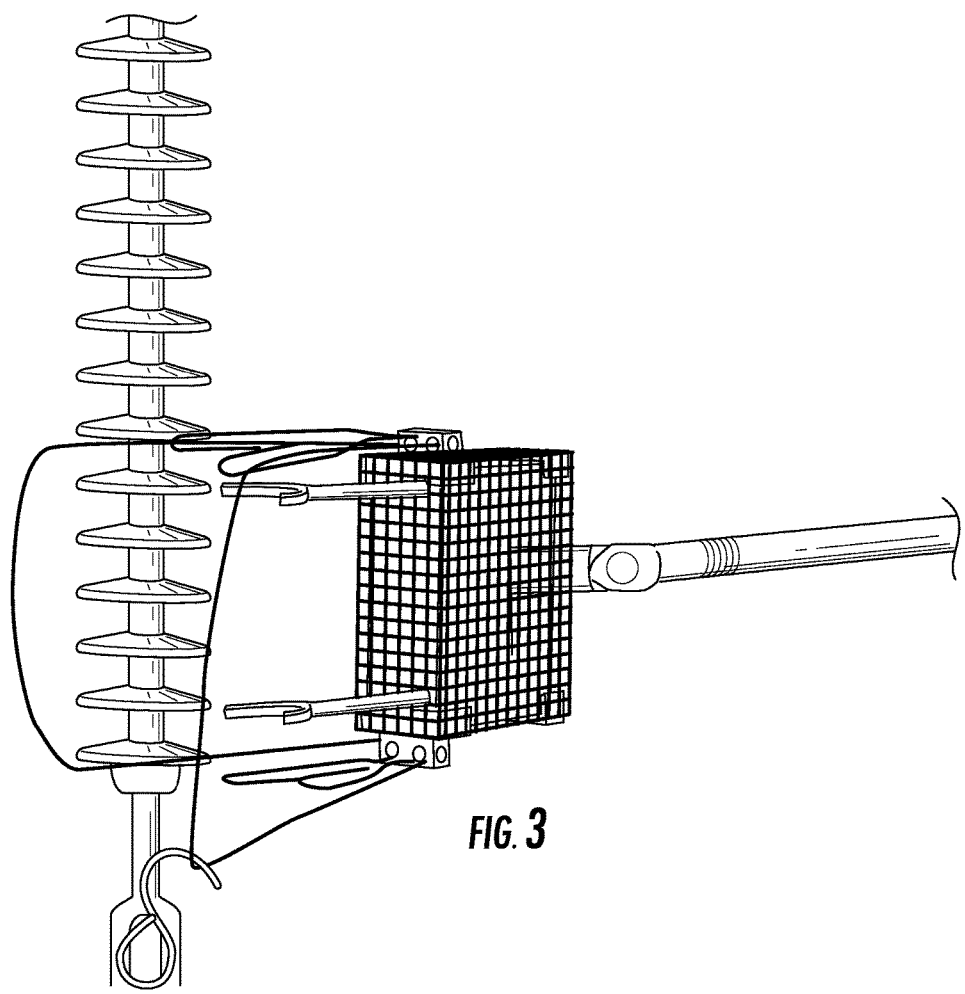
FIG. 3 shows the detector of FIG. 1 being installed on an insulator.

The detector 10 is portable, self-contained, lightweight, able to be used on energized installed insulators, may be installed on the end of an insulated lineman's pole or "hotstick" (denoted "H" in FIG. 3) or held by hand, and provides a simple Go/No-Go output. The detector 10 is not only applicable to polymer insulators, but also to other insulating components such as fiberglass hot sticks, guy strain insulators, fiberglass cross-arms, composite poles, and the like. Thus, the technology incorporated in the detector 10 does not necessarily need to be utilized to evaluate components that fill an electrical function; rather, it is applicable to any component which is manufactured from a material having insulating properties where the internal or external condition being sought is conductive, semi-conductive, or has a high permittivity.

As shown, the detector 10 includes a Faraday cage 11 (also called a guard electrode), a pair of extension elements referred to as "tuning forks" 12 and 13, a pair of extension elements referred to as "bunny ears" 14 and 15, a grounded enclosure 16, a universal hotstick receiver 17, a high voltage electrode assembly 18, and a grounded electrode assembly 19. The cage 11 houses the enclosure 16 and ensures that measurements taken by the detector 10 are not impacted by the presence of nearby conductive objects. The cage 11 also reduces high electric field and arcing effects on the detector 10 when it is in energized environments. The enclosure 16 may be electrically bonded to the cage 11 or electrically floating with respect to the cage 11. As shown, the enclosure 16 is electrically floating and houses all of the electronics needed for the detector 10 to operate, including circuit boards, batteries, and power supplies to shield the electronics from electrical disturbances, electric fields, and arcing.

The tuning forks 12, 13 and bunny ears 14, 15 extend the Faraday cage 11 around the electrode assemblies 18 and 19. The tuning forks 12 and 13 are configured such that they make mechanical and electrical contact with end fittings of an insulator (FIG. 3) to prevent arcing to the detector 10 when measurements are being made close to energized and grounded end fittings of an insulator.

The receiver 17 is connected to the enclosure 16 and is bonded to the cage 11. The receiver 17 is adapted to receive and connect to a hotstick to allow the detector 10 to be placed on an energized insulator. The receiver 17 includes a slot 20 for receiving a connector of a hotstick and a plurality of blocks 21 to form a castellated end 22 that meshes with a castellated end of the hotstick (not shown), thereby preventing the detector 10 from rotating with respect to the hotstick during installation. The castellated end 22 also allows the hotstick to be secured to the detector 10 at various angles relative to the hotstick to allow for easier installation.

Figure 4:
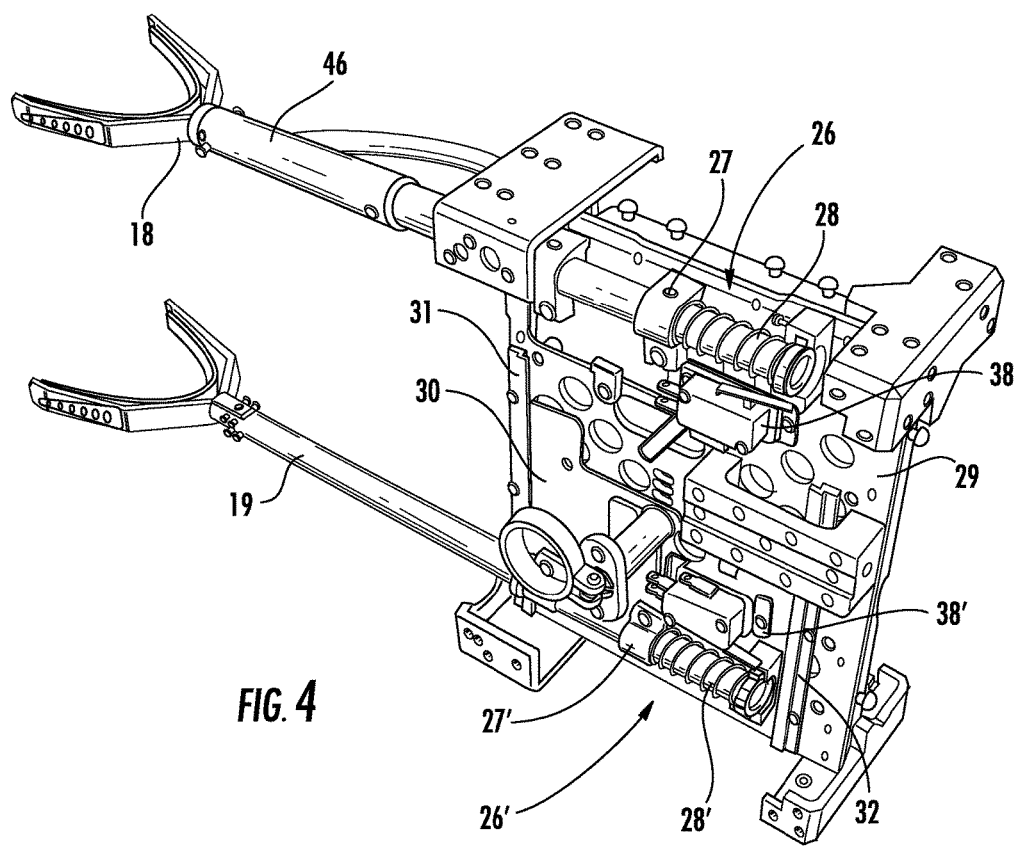
FIG. 4 shows the detector of FIG. 2 with a casing removed.
Figure 5:
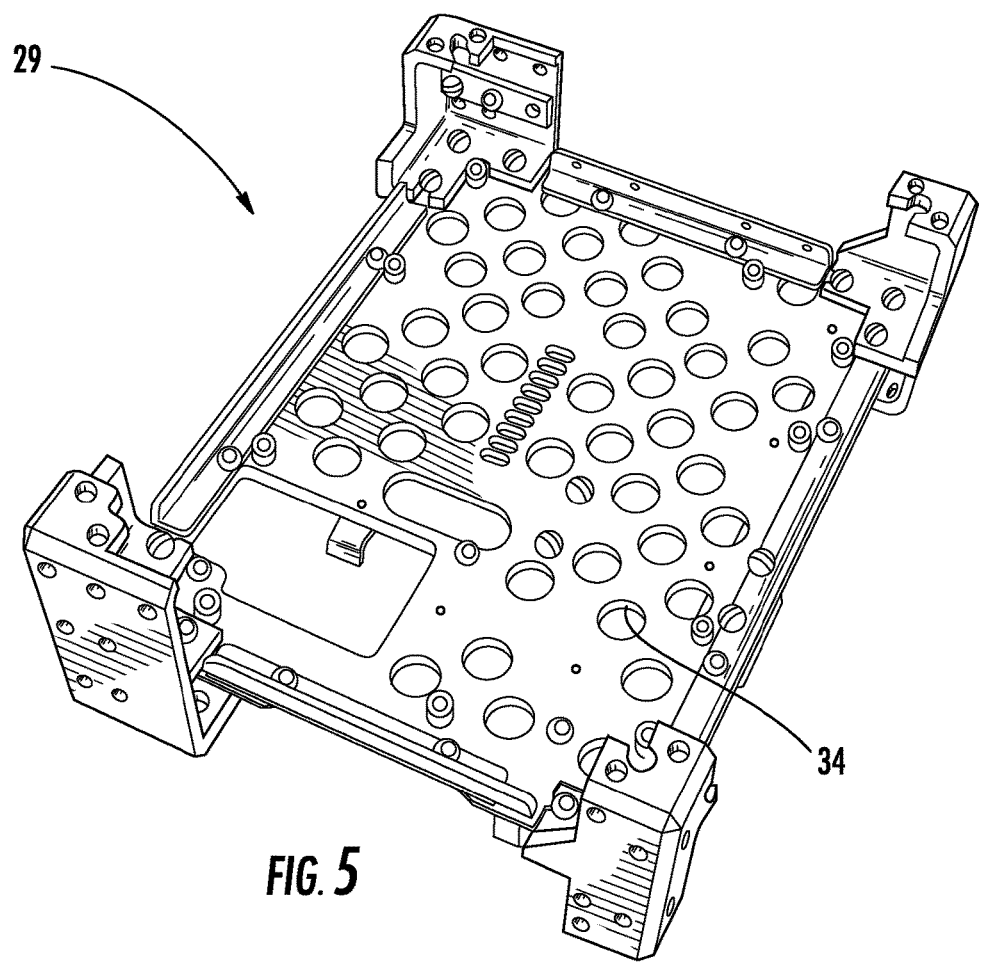
FIG. 5 shows a chassis of the detector of FIG. 1.
Figure 6:
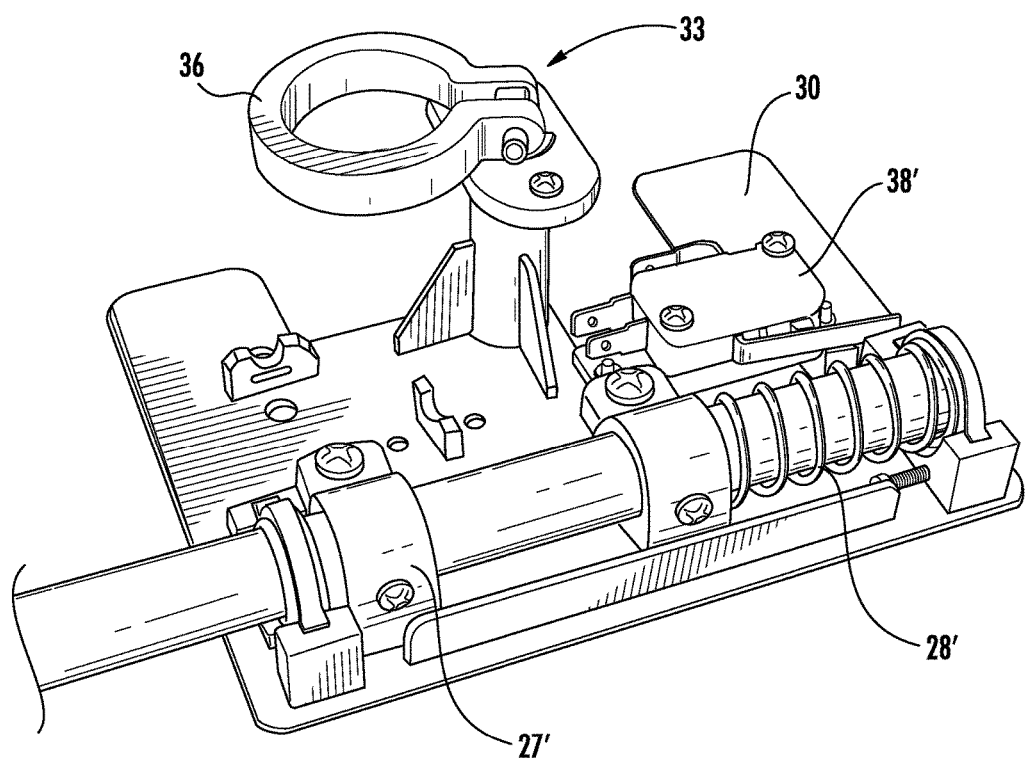
FIG. 6 shows a travelling plate for interaction with the chassis of FIG. 5.

Referring to FIG. 4, the electrode assemblies 18 and 19 are attached to spring loaded mechanisms 26 and 26' respectively so that they can move linearly in and out from the enclosure 16. Electrode assembly 18 is connected to mechanism 26 and electrode assembly 19 is connected to mechanism 26'. The mechanisms 26 and 26' include bushings 27 and 27' respectively and springs 28 and 28' respectively to aid in the linear movement of the electrode assemblies 18 and 19. Mechanism 26 is connected to a chassis 29 (FIG. 5) and mechanism 26' is connected to both the chassis 29 and a travelling plate 30 (FIG. 6) which is adapted to move along rails 31 and 32 to allow the distance between the electrode assemblies 18 and 19 to be adjusted relative to each other to allow for different designs of insulators to be accounted for. As shown, the traveling plate 30 and mechanism 26' are secured in position to the chassis 29 by a spring loaded connector 33, FIG. 6, which pushes a spring-biased pin through the travelling plate 30 and into apertures 34 of the chassis 29 to prevent movement of the plate 30 along the rails 31, 32.

To move the plate 30 along the rails 31 and 32 and adjust the distance between electrode assemblies 18 and 19, a user pulls on a handle 36 of the connector 33 which moves the pin against the bias of the spring and disengages the pin from an aperture 34 of the chassis 29 to allow the plate 30 to move. Once the plate 30 and electrode 19 is in position, the user releases the handle 36 and the spring forces the pin into an aperture 34 of the chassis 29.

Figure 7:
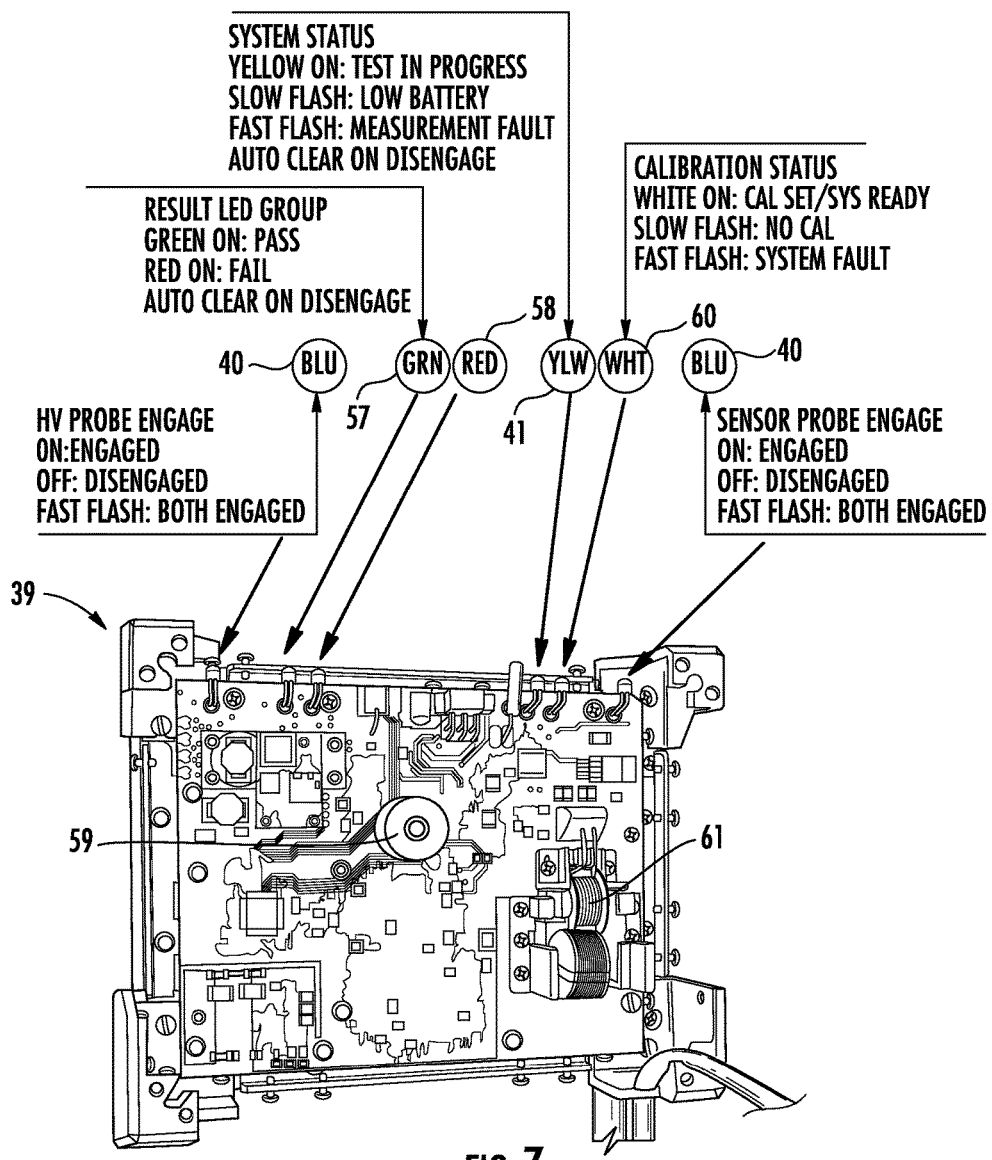
FIG. 7 shows electronics of the detector of FIG. 1.

Micro-switches 38 and 38' are also attached to the chassis 29 and are operably connected to the electrode assemblies 18 and 19 respectively and electrically coupled to electronics 39, such that signals from the micro-switches 38 and 38' indicate to electronics 39, FIG. 7, that a user has pushed the electrodes against an insulator and they are engaged. The micro-switches 38 and 38' are engaged when the electrodes have linearly moved into a predefined range, for example between about 19 mm (0.75 in.) and 25 mm (1.0 in.). The electronics 39 are programmed such that the detector 10 will only initiate a measurement when the micro-switches inform the electronics 39 that both electrode assemblies 18 and 19 are fully engaged. Light emitting diodes ("LEDs") 40 communicate to a user whether and which electrode is engaged. If during a measurement process, one electrode is disengaged the user is informed by LED 41 that the measurement is not valid. In addition, audible beeping tones are used to communicate the engagement of the electrodes in the event that the user cannot see LEDs 40. The tones are activated when an electrode is engaged. A slow tone indicates that the grounded electrode is engaged and a fast tone indicates that the high voltage electrode is engaged. The tones are particularly useful in allowing a user to manipulate the detector 10 at the end of the hotstick to make sure both electrodes are engaged at the same time. When both electrodes are engaged, a solid tone is emitted to indicate that a measurement is taking place.

Figure 8:
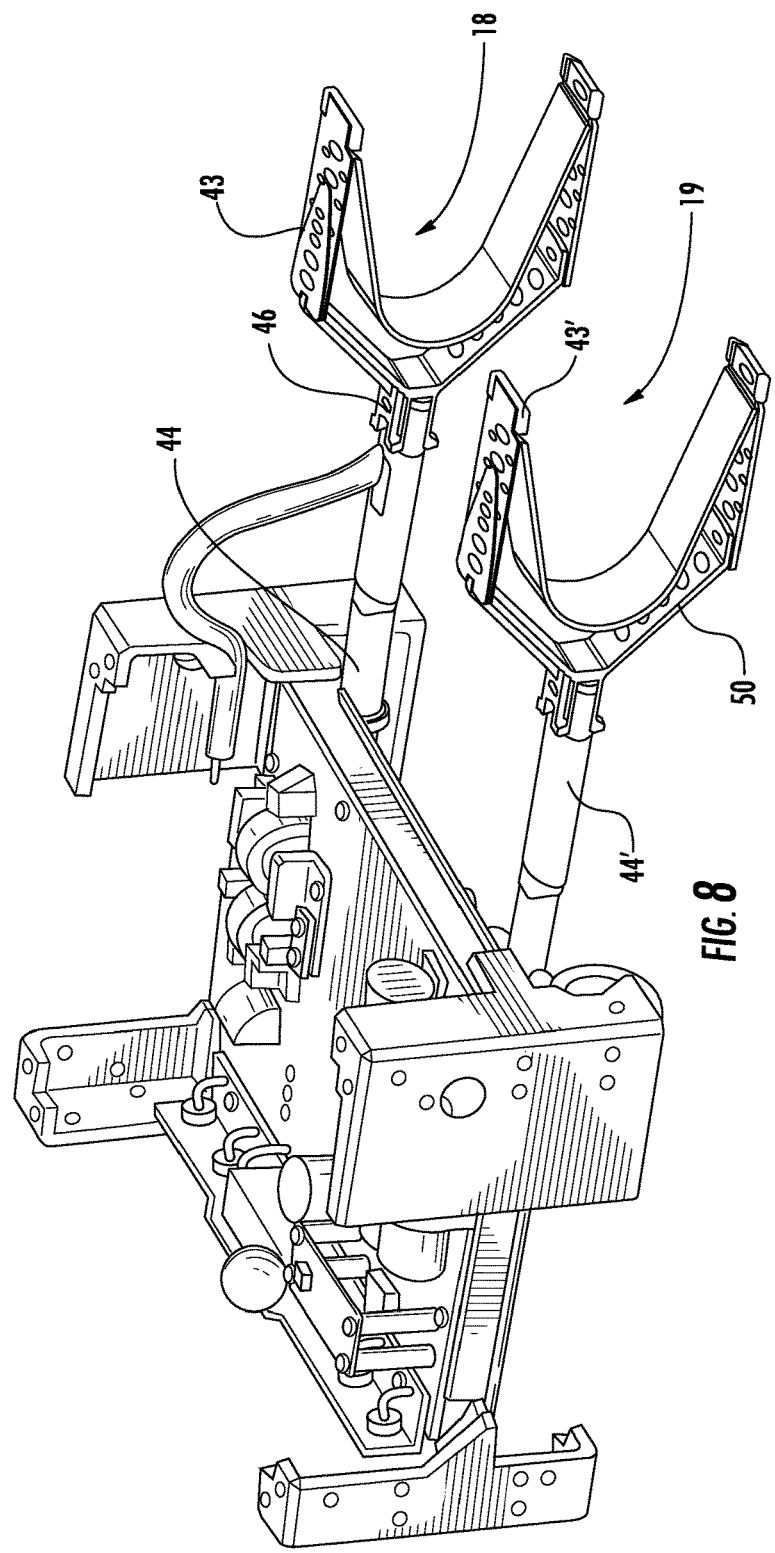
FIG. 8 is a perspective view of the chassis of FIG. 5 with electrode assemblies connected thereto.

Referring to FIG. 8, the high voltage electrode assembly 18 includes a high voltage electrode 43 connected to a metallic shaft 44 by an insulating rod 46. In this example the insulating rod 46 is fiberglass, however any suitable insulating material may be used. The insulating rod 46 electrically insulates the electrode 43 from the metallic shaft 44. The metallic shaft 44 connects the electrode assembly 18 to mechanism 26. Electrode assembly 19 includes a grounded electrode 43' connected to a metallic shaft 44'. The shaft 44' connects the electrode assembly 19 to mechanism 26'. The grounded electrode 43' and mechanisms 26 and 26' are grounded electrically to the chassis 29.

Figure 9:
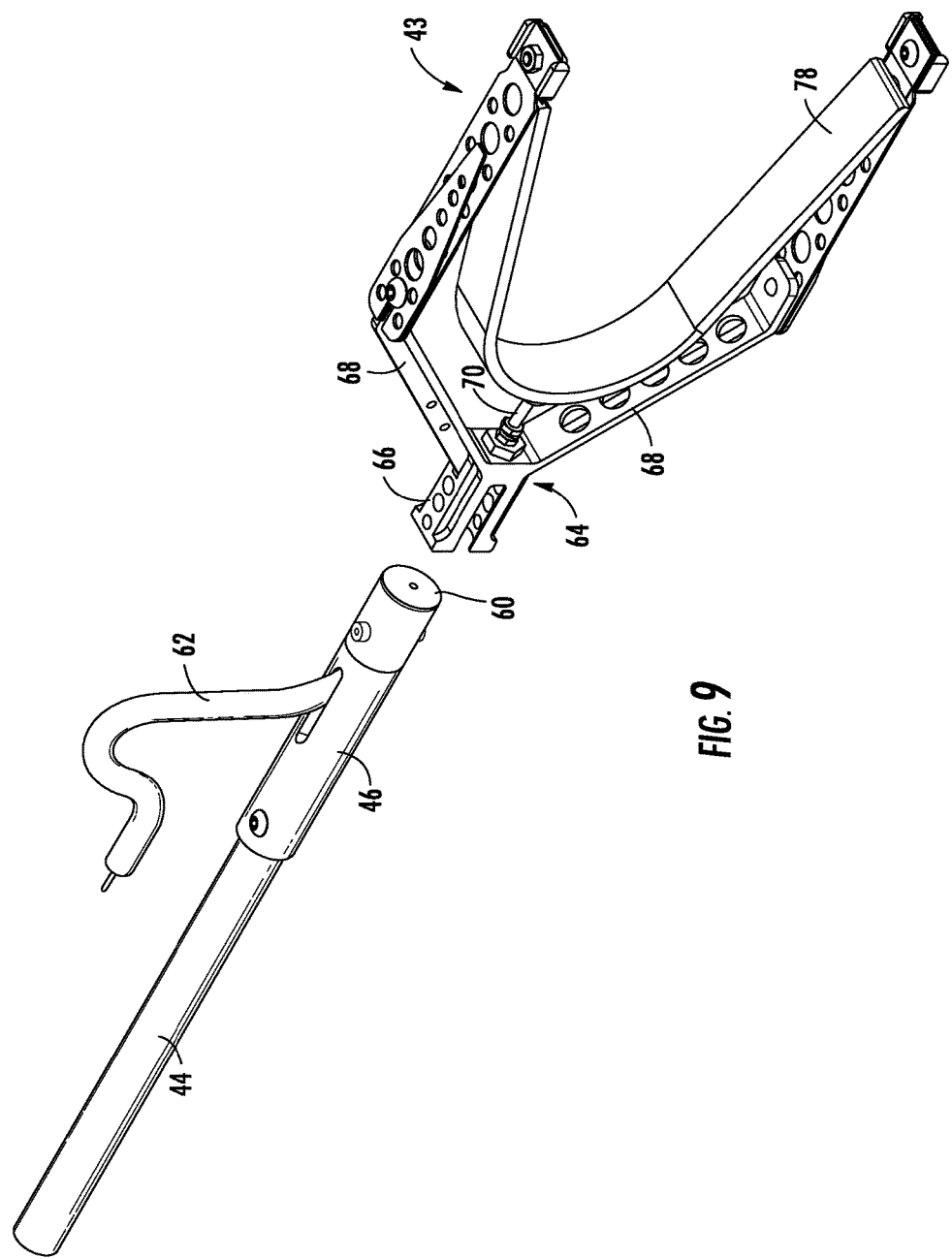
FIG. 9 is a perspective, partially-exploded view of one of the electrode assemblies of FIG. 8.
Figure 10:
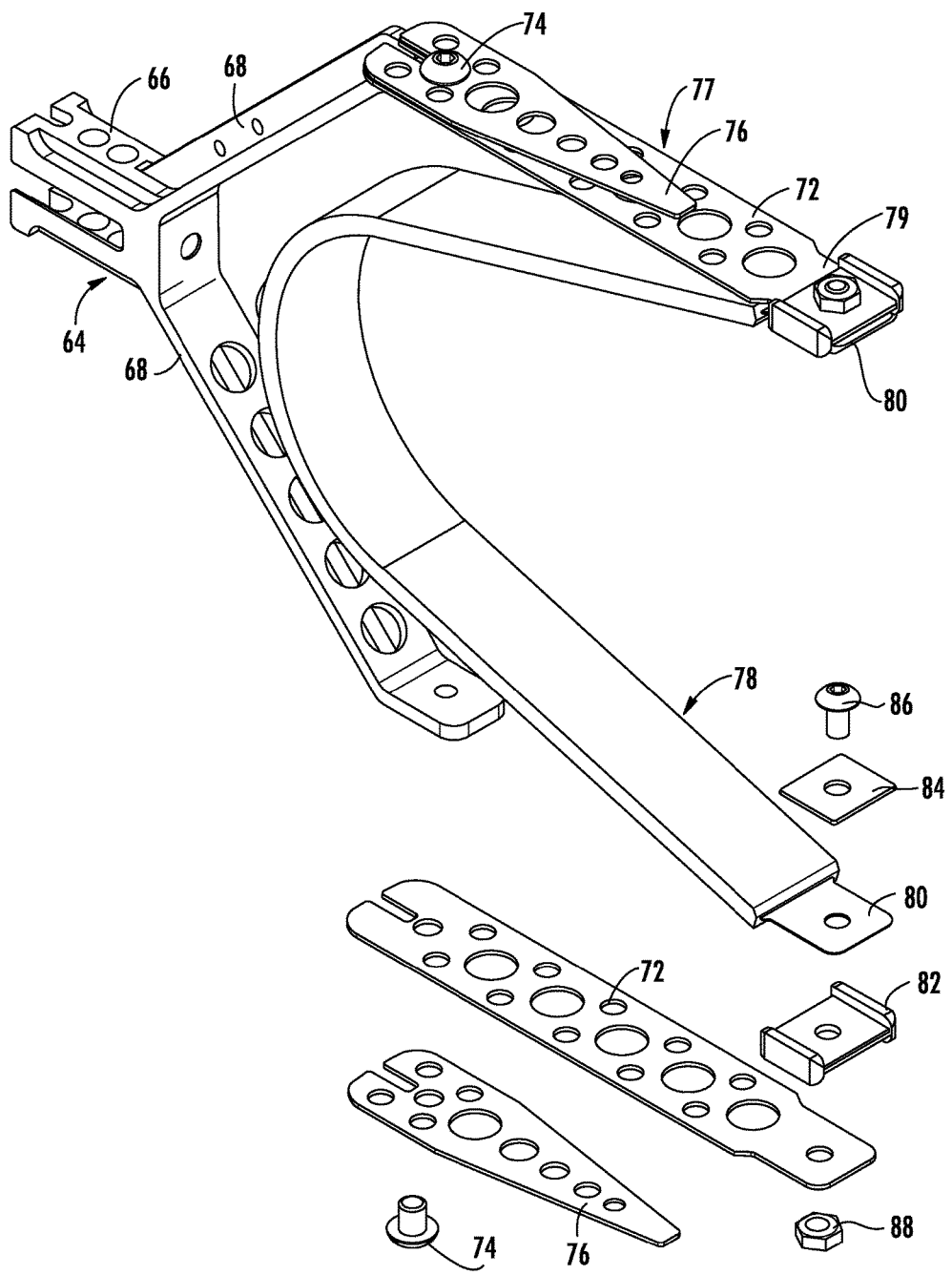
FIG. 10 is a perspective view of a portion of the electrode assembly of FIG. 9.

FIGS. 9 and 10 illustrate the high voltage electrode assembly 18 in more detail. The insulating rod 46 is hollow and has a terminal 60 with a cylindrical exterior surface disposed at a distal end thereof. A grounding cable 62 is partially routed through the interior of the insulating rod 46 and is electrically connected to the terminal 60. The grounding cable is also electrically connected to the chassis 29.

The electrode 43 includes a frame 64 which is generally Y-shaped with a base 66 and a pair of diverging beams 68. The base 66 is configured in shape and size to fit over and engage the distal end of the insulating rod 46 and the terminal 60. It may be secured to the terminal 60 using a fastener 70 such as the illustrated screw (this enables field replacement).

Referring to FIG. 10, each beam 68 has an extension 72 connected thereto, for example using fastener 74. The extension 72 has a generally rectangular shape in plan view and may be made of a thin resilient material such as a steel alloy. Functionally it acts as a first spring element.

Each beam 68 also has a leaf spring 76 connected thereto. More specifically, the leaf spring 76 lies flat against the extension 72 at least a portion of the extension 72 and the leaf spring 76 are clamped together. The fastener 74 may be used to clamp both the extension 72 and the leaf spring 76 to the beam 68. The leaf spring 76 is tapered at one end such that the plan view shape resembles a rectangle connected to a trapezoid. The leaf spring 76 may be made of a thin resilient material such as a steel alloy. Functionally the leaf spring 76 acts as a second spring element. Collectively, the beam 68, the extension 72, and the leaf spring 76 define an arm 77 of the electrode 43. Together the extension 72 and leaf spring 76 act as a variable-rate spring. It is noted that the technical term "spring rate" describes the functional properties of a spring, more specifically the force generated by the spring for a specified deflection from a neutral position. For example, a spring rate may be expressed in units of force per unit deflection. A variable-rate spring has a rate which is not constant for all deflections. For example, a variable-rate spring may have a low spring rate at small deflections and a higher spring rate for larger deflections, or it may have a high spring rate for small deflections and a lower spring rate for larger deflections.

A generally U-shaped stabilizing probe 78 having a pair of distal ends 80 is disposed between the arms 77. Each distal end 80 of the stabilizing probe 78 is connected to a respective distal end 79 of one of the arms 77, for example using the illustrated anti-rotation bracket 82, clamp 84, screw 86, and nut 88.

Figure 11:
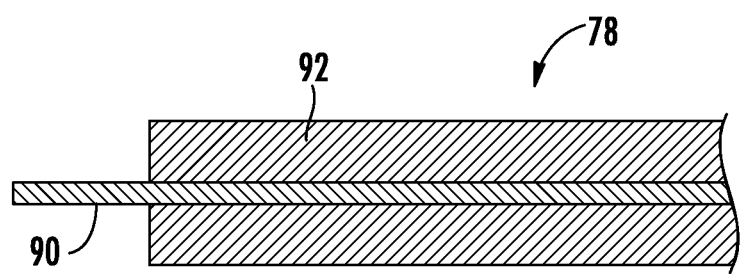
FIG. 11 is a cross-sectional view of a portion of a probe shown in FIG. 10.

As best seen in FIG. 11, the stabilizing probe 78 comprises an inner tensile strip 90 made of a thin resilient, electrically conductive material such as a steel alloy, embedded within a cover 92 of a resilient electrically insulating material such as natural or synthetic rubber. In the illustrated example the cover 92 comprises silicone rubber. The stabilizing probe 78 may be constructed by a technique such as overmolding the cover 92 to the tensile strip 90.

Figure 12:
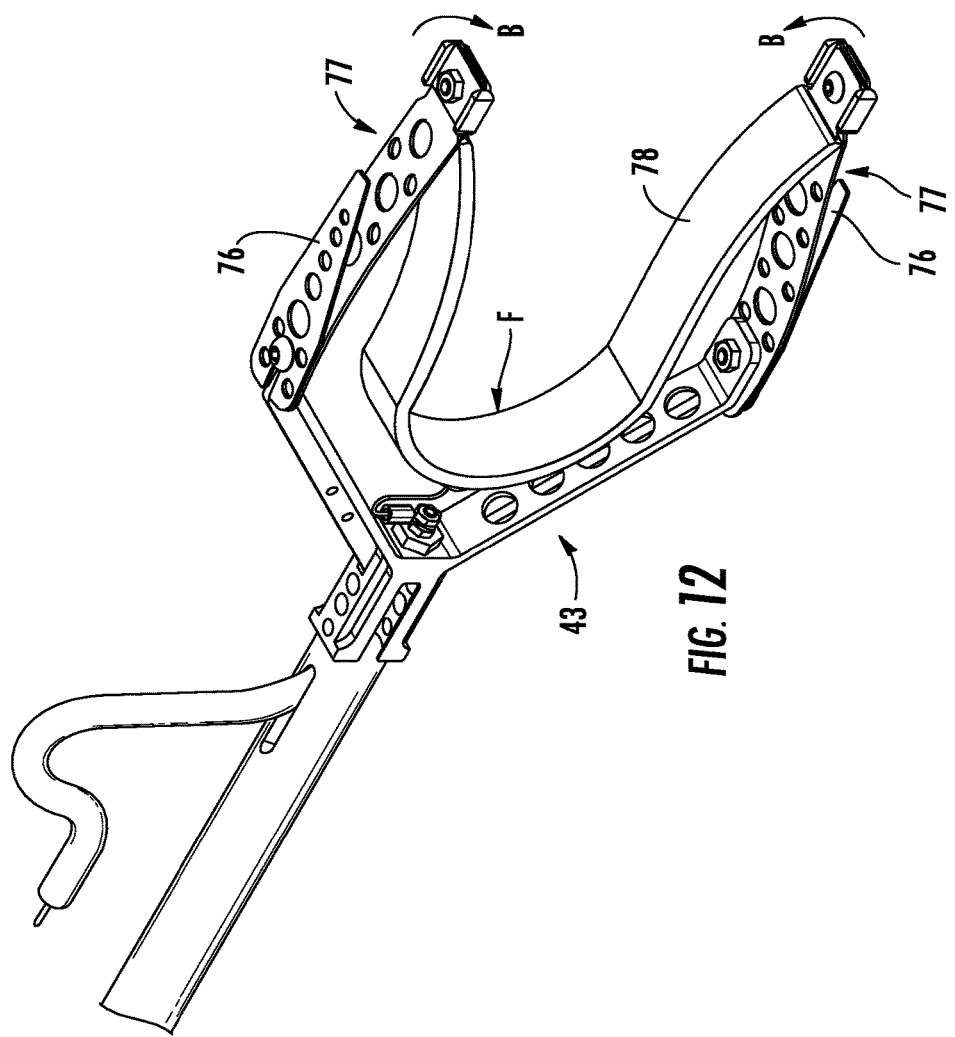
FIG. 12 is a perspective view of an electrode assembly shown in a flexed position.

FIG. 12 shows the response of the electrode 43 to a force "F" being applied to the stabilizing probe 78. The electrode 43, specifically the arms 77, are able to flex inwards from a neutral position (see arrows "B"), such that the probe 78 can flex and conform to the exterior of an insulator. As noted above, the presence of the leaf springs 76 provide a variable spring rate. This flex behavior enables the stabilizing probe 78 to conform to insulators having a wide variety of sizes.

Figure 13:
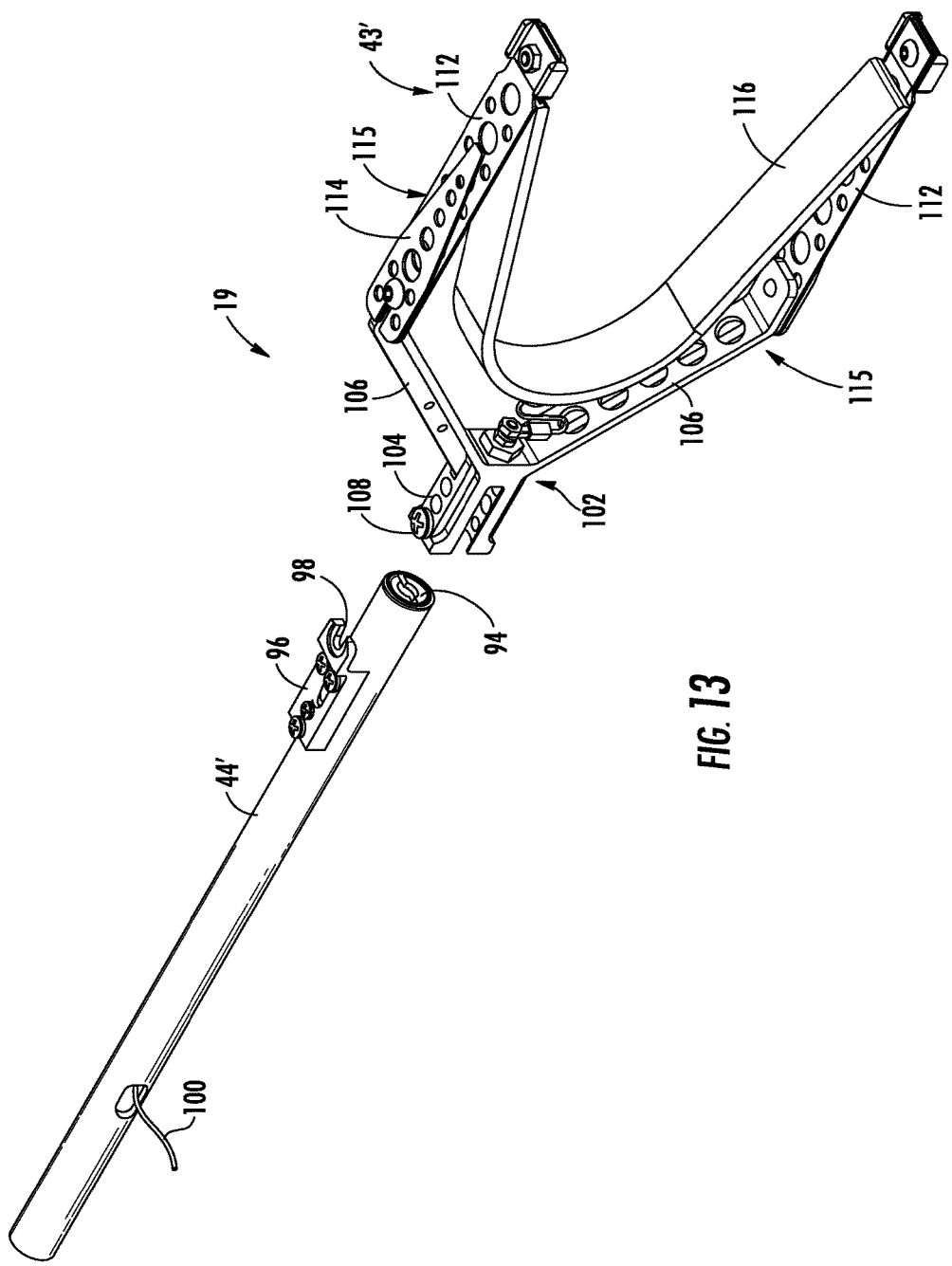
FIG. 13 is a perspective partially-exploded view of one of the electrode assemblies of FIG. 8.
Figure 14:
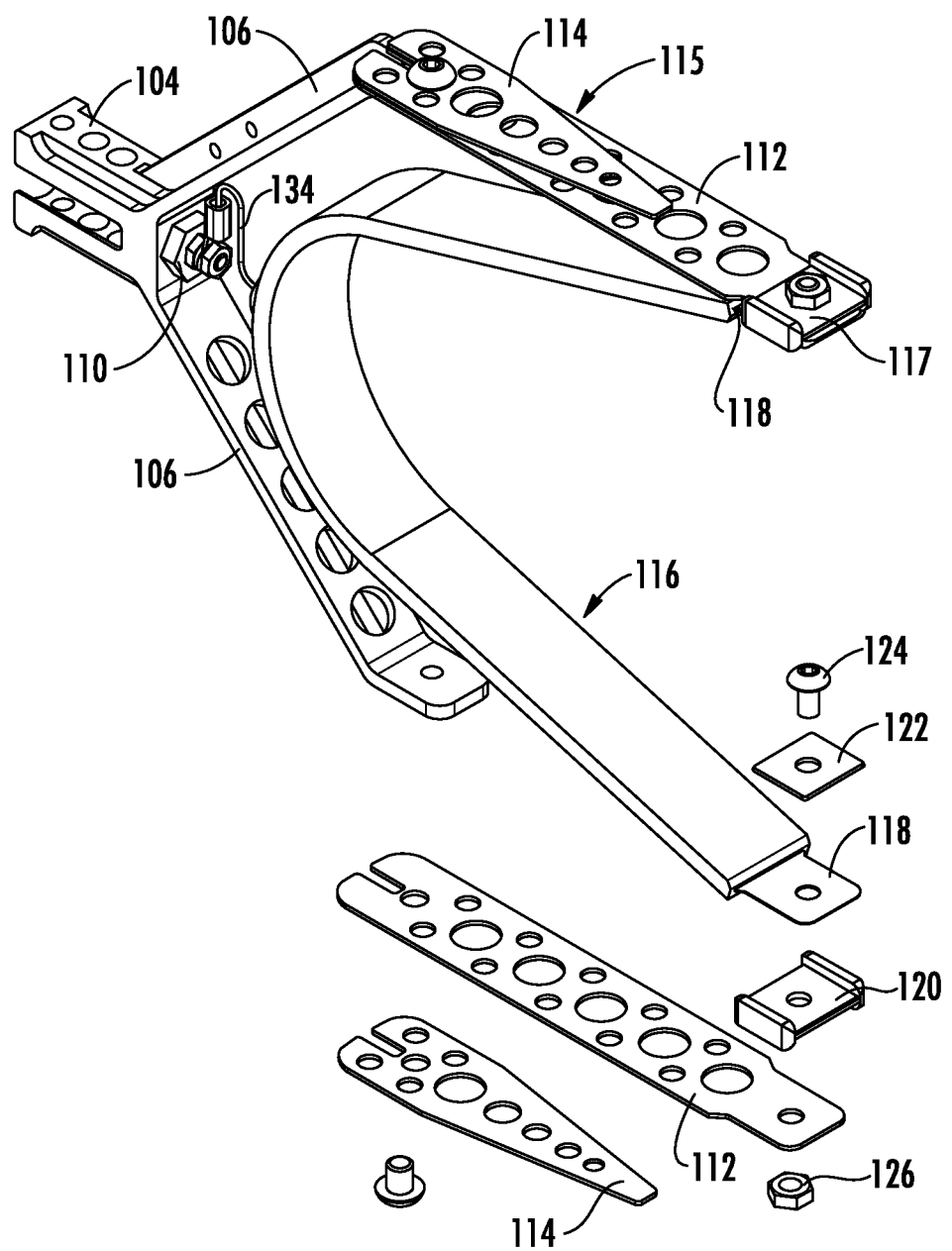
FIG. 14 is a perspective view of a portion of the electrode assembly of FIG. 13.

FIGS. 13 and 14 illustrate the grounded electrode assembly 19 in more detail. The metallic shaft 44' is hollow with a cylindrical exterior surface. A socket 94 is disposed at a distal end thereof. A bracket 96 with a fork 98 is attached to the metallic shaft 44' near the distal end. A sensing cable 100 is partially routed through the interior of the metallic shaft 44' and is electrically connected to the socket 94. The sensing cable 100 is also electrically connected to the electronics 39.

The electrode 43' is generally similar in construction to the electrode 43 described above. Portions of the electrode 43' not specifically described may be considered to be identical to the electrode 43. The electrode 43' includes a frame 102 with a base 104 and diverging beams 106. The base 104 is configured in shape and size to fit over and engage the distal end of the metallic shaft 44' and includes a locking feature configured to engage the fork 98, such as the illustrated lock screw 108.

Figure 15:
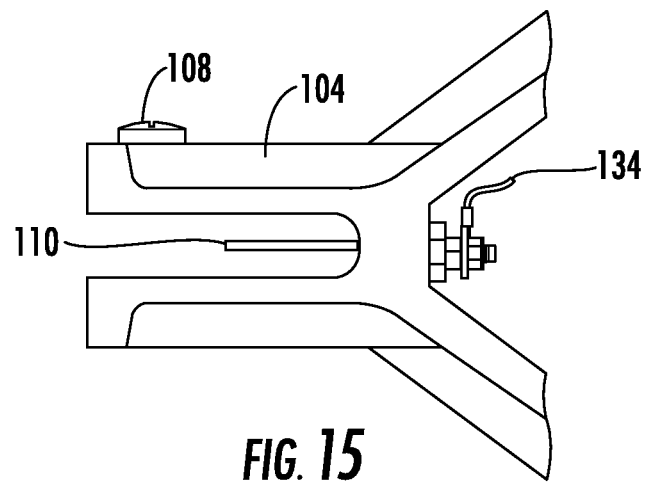
FIG. 15 is a side view of a portion of the electrode assembly of FIG. 13.

The base 104 receives a terminal pin 110. As best seen in FIG. 15, the terminal pin 110 is mounted extending parallel to the long direction of the base 104, such that when the base is placed over the distal end of the shaft 44' the terminal pin 110 will be guided into the socket 94.

Each beam 106 includes an extension 112 and leaf spring 114 as described above for the electrode 43. Collectively the beam 106, extension 112, and leaf spring 114 defines an arm 115 of the electrode 43'. A generally U-shaped sensing probe 116 having a pair of distal ends 118 is disposed between the arms 115. Each distal end 118 of the sensing probe 116 is connected to a respective distal end 117 of one of the arms 115, for example using the illustrated anti-rotation bracket 120, clamp 122, screw 124, and nut 126.

Figure 16:
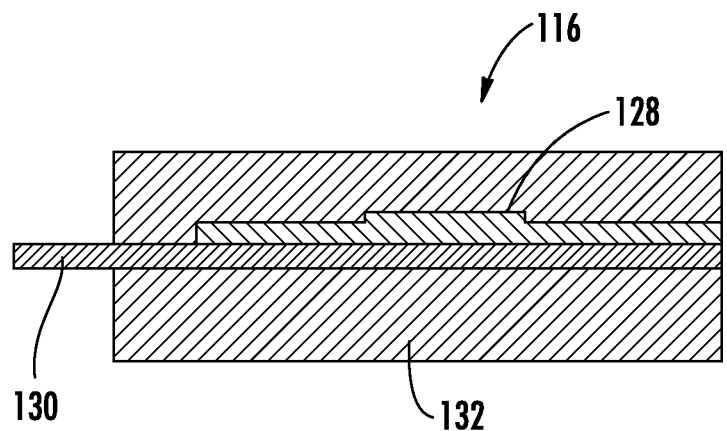
FIG. 16 is a cross-sectional view of a portion of a probe shown in FIG. 14.

As best seen in FIG. 16, the sensing probe 116 comprises a sensor 128 incorporated into a printed circuit board, abutting an inner tensile strip 130 made of a thin resilient material such as a steel alloy. The sensor 128 and the inner tensile strip 130 are embedded within a cover 132 of a resilient electrically insulating material such as natural or synthetic rubber. In the illustrated example the cover 132 comprises silicone rubber. The sensing probe 116 may be constructed by a technique such as overmolding the cover 132 to the sensor 128 and the tensile strip 132. The flex behavior of the electrode 43' is substantially the same as that of the probe 43, illustrated in FIG. 12. The sensing probe 116 can flex and conform to the exterior of an insulator, and can accommodate a wide variety of insulator sizes. The sensor 128 is electrically connected to the terminal pin 110 by a lead 134.

Referring to FIG. 7, the electronics 39 include a microprocessor which controls all of the measurement and communication processes. Once the electrodes are adjusted to the desired spacing, the user calibrates the device either with "nothing" between the electrodes or a "known" good section of insulator. LED 60 provides the calibration status. The electronics 39 use this against which to compare values. In performing measurements, the detector 10 is pushed against a good section of insulator until the micro-switches 38 and 38' provide an electrical signal to the LEDs 40 (one for each electrode assemblies, i.e., grounded and HV) to indicate that the electrodes are engaged or until a command is received by an RF receiver 56 from an RF control device (not shown). When LEDs 40 are lit, a measurement takes place.

Once the detector 10 is engaged, a high voltage resonant voltage supply 61 sweeps through a frequency range and determines the resonance frequency of the insulator. A high voltage at the resonant frequency is then supplied for a pre-determined amount of time, for example, 10 seconds. During this time, the current in HV supply, the drive level from power electronics to supply, the resonant frequency, and the measurements from sensing probes 50 are measured. The results are then compared against the "calibration" values. Depending whether the results are within some "predefined band" from the initial calibration, LED 57 or LED 58 is provided to the user. The results may also be sent to an RF enabled wireless device and/or via buzzer 59. Through the measurement process the buzzer 59 sounds so that the user knows a measurement is being made. The high voltage supply 61 is a custom high frequency (for example 1-2 MHz) high voltage supply (for example 1-3 kV) that uses a custom ferrite transformer and power electronics to generate the required voltage.

The RF receiver 56 allows the unit to be remotely controlled and to provide results to an RF enabled device. In the implementation, Wi-Fi is used and the device hosts an HTML interface (web page) which allows a laptop, phone or tablet to control the device and report results. This option is not always used—the user may also simply use LEDs 40, 41, 57, 58 together with the buzzer 59.

The detector 10 may also be battery powered. The battery may be rechargeable, such as a lithium-polymer battery. The electronics 39 may incorporate charging control programming for batteries requiring special charging procedures, and is capable of receiving power from an 8-14V DC source, e.g. from an automobile battery.

In operation, a test sequence is initiated by either the operator pushing the electrodes against the insulator or by a signal transmitted from a remote RF enabled device (in this case any Wi-Fi enabled computer, phone or tablet). A high frequency (for example 1-2 MHz) high voltage (for example 1-3 kV) is placed across a section of the insulator, and the sensing probe 50 integrated into the grounded electrode 43' measures the capacitive and resistive currents. LED 57 indicates whether there is a condition based on (a) the sensing probe measurement, (b) the current drawn by the high voltage supply 61, and (c) the resonant frequency of the high voltage supply. LED 41 provides an indication of any erroneous measurement such as (a) the measurements do not fit the expected profile, (b) contact is lost with the insulator, (c) the on-board battery voltage is low, and (d) self-diagnostics of the electronics. The remote RF enabled device also provides these indications plus more detailed information. It also keeps a history of the measurements and provides a graph of measurements along the insulator.

The foregoing has described an apparatus and method for identifying the presence of high conductivity or permittivity conditions in a wide range of electrically insulating materials. All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends to any novel one, or any novel combination, of the features disclosed in this specification (including any accompanying claims, abstract and drawings), or to any novel one, or any novel combination, of the steps of any method or process so disclosed.

What is claimed is:

1. An apparatus for use in evaluating an electrical insulator, comprising:
   a frame having a base and a pair of spaced-apart resilient arms each having a distal end; and
   a flexible probe having a flexible metallic tensile strip embedded within an insulator cover disposed between the arms and configured to receive the electrical insulator, the flexible probe being generally U-shaped and having a pair of distal ends, each distal end of the probe being connected to a respective distal end of one of the arms.

2. The apparatus of claim 1 wherein each of the arms comprises first and second spring elements clamped together.

3. The apparatus of claim 2 wherein the first spring element is an extension with a rectangular plan shape, and the second spring element is a leaf spring with a tapered shape.

4. The apparatus of claim 2 wherein:
   each arm comprises a beam extending from the base; and
   mutual proximate ends of the first and second spring elements are clamped to an end of the beam.

5. The apparatus of claim 1 further comprising:
   a metallic shaft; and
   an insulating rod connected to the metallic shaft, wherein the base is coupled to the insulating rod such that the base is electrically insulated from the metallic shaft.

6. The apparatus of claim 5 further comprising:
   a terminal disposed at a distal end of the insulating rod wherein the base is electrically connected to the terminal; and
   a grounding cable coupled to the terminal.

7. The apparatus of claim 1 wherein the probe further comprises a sensor embedded within the insulating cover.

8. The apparatus of claim 7 wherein:
   a terminal pin is mounted in the base; and
   the sensor is electrically connected to the terminal pin by a lead.

9. The apparatus of claim 8 further comprising a metallic shaft, wherein the base is coupled to a distal end of the metallic shaft.

10. The apparatus of claim 9 further comprising:
    a socket disposed at the distal end of the metallic shaft, such that the terminal pin engages the socket.

11. An apparatus for identifying high risk insulators with conductive or high permittivity defects, comprising:
    an enclosure containing electronics for controlling measurement and communication processes; and
    first and second spaced-apart electrode assemblies for engaging an insulator to be tested, the first and second electrode assemblies being mounted to the enclosure and operably connected to the electronics;
    wherein each of the first and second electrode assemblies comprise:
    a frame having a base and a pair of spaced-apart resilient arms each having a distal end; and
    a flexible probe disposed between the arms and configured to receive the electrical insulator, the flexible probe being generally U-shaped and having a pair of distal ends, each distal end of the probe being connected to a respective distal end of one of the arms.

12. The apparatus of claim 11 wherein each of the arms is configured to have a variable spring rate.

13. The apparatus of claim 11 wherein each of the arms comprises first and second spring elements clamped together.

14. The apparatus of claim 13 wherein the first spring element is an extension with a rectangular plan shape, and the second spring element is a leaf spring with a tapered shape.

15. The apparatus of claim 13 wherein:
    each arm comprises a beam extending from the base; and
    mutual proximate ends of the first and second spring elements are clamped to an end of the beam.

16. The apparatus of claim 11 wherein the probe comprises a flexible metallic tensile strip embedded within an insulating cover.

17. The apparatus of claim 16 wherein the first electrode assembly comprises:
    a first metallic shaft mounted to the enclosure; and
    an insulating rod connected to the metallic shaft, wherein the base of the first electrode assembly is coupled to the insulating rod such that the base of the first electrode assembly is electrically insulated from the metallic shaft.

18. The apparatus of claim 17 further comprising:
    a terminal disposed at a distal end of the insulating rod wherein the base of the first electrode assembly is electrically connected to the terminal; and
    a grounding cable coupled to the terminal and to the enclosure.

19. The apparatus of claim 11 wherein the probe of the second electrode assembly further comprises a sensor embedded within the insulating cover.

20. The apparatus of claim 19 wherein the second electrode assembly comprises:
    a second metallic shaft mounted to the enclosure; and
    an insulating rod connected to the second metallic shaft, wherein the base of the second electrode assembly is coupled to the second metallic shaft.

21. The apparatus of claim 20 wherein:
    a terminal pin is mounted in the base of the second electrode assembly; and
    the sensor is electrically connected to the terminal pin by a lead; and
    a socket disposed at the distal end of the second metallic shaft, such that the terminal pin engages the socket.

22. The apparatus of claim 11 wherein the first and second electrode assemblies are mounted for linear movement relative to the enclosure.

* * * * *